United States Patent [19]

Bessot et al.

[11] 4,422,407
[45] Dec. 27, 1983

[54] APPARATUS FOR CHEMICALLY ACTIVATED DEPOSITION IN A PLASMA

[75] Inventors: Jean-Jacques Bessot, Arpajon; Bernard Bourdon, Gometz le Chatel, both of France

[73] Assignee: Compagnie Industrille des Telecommunications Cit-Alcatel, Paris, France

[21] Appl. No.: 302,936

[22] Filed: Sep. 16, 1981

[30] Foreign Application Priority Data

Sep. 17, 1980 [FR] France ................................ 80 19983

[51] Int. Cl.$^3$ ............................................. C23C 13/08
[52] U.S. Cl. ................................... 118/723; 118/50.1;
118/728; 427/38; 204/298
[58] Field of Search ....................... 118/50.1, 723, 725,
118/728, 730; 427/38, 39; 204/164, 298

[56] References Cited

U.S. PATENT DOCUMENTS

| | | | |
|---|---|---|---|
| 3,637,434 | 1/1972 | Nakanuma et al. | 118/725 X |
| 4,123,316 | 10/1978 | Tsuchimoto | 156/643 |
| 4,225,222 | 9/1980 | Kempter | 427/39 X |
| 4,298,443 | 11/1981 | Maydan | 204/298 |

FOREIGN PATENT DOCUMENTS

| | | | |
|---|---|---|---|
| 146626 | 2/1981 | German Democratic Rep. | 118/728 |
| 107723 | of 0000 | Fed. Rep. of Germany | |
| 2951453 | of 0000 | Fed. Rep. of Germany | |
| 2354393 | of 0000 | France | |

OTHER PUBLICATIONS

IBM Technical Disclosure Bulletin vol. 14 No. 9, Feb. 1972 p. 2251 "Gas Injection System" by R. R. Garnache and K. W. Zyber.

Primary Examiner—John D. Smith
Assistant Examiner—Bernard F. Plantz

[57] ABSTRACT

An apparatus for chemically activated depositing in a plasma. Said apparatus includes a chamber (1) in which a vacuum is maintained, said chamber being closed by means of a top plate (2) and a bottom plate (3) which are removable. Said apparatus further includes a substrate support (5) disposed about said axis, a reactive gas distributor manifold and means (4) for setting up a plasma inside said chamber (1). Said manifold (8) has two circular end portions (9,10) interconnected by pipes (11) in which gas outlet orifices are provided; said pipes being rotatable at a uniform speed about the axis of the chamber inside said substrate support; said support being of polygonal cross-section and constituted by rectangular longitudinally extending facets on which the substrates (7) are deposited.

The invention is used to deposit chromium, silicon, aluminium and the like.

2 Claims, 6 Drawing Figures

4,422,407

APPARATUS FOR CHEMICALLY ACTIVATED DEPOSITION IN A PLASMA

The present invention relates to an apparatus for chemically activated deposition in a plasma.

BACKGROUND OF THE INVENTION

Chemically activated deposition consists in carrying out a chemical reaction in a chamber between gaseous reactants so that a product of the reaction is deposited on substrates which are to be covered, and others are removed from the chamber in gaseous form.

Such a reaction is activated by heating the substrates and the reactant gas or by setting up and maintaining an electric discharge through the gas. This has the effect of ionizing some of the gas molecules and of increasing the chemical activity of others.

Ionizing the gas in this way avoids heating the substrates to temperatures as high as 1000° C. to 1200° C. Depositing can then be carried out at ambient temperature or at a temperature of only 200° C. to 300° C.

The electric discharge can be set up and maintained by means of a high-frequency AC magnetic field created by a winding. This method is herein referred to as the "inductive" system.

A DC or high-frequency electric field can also be used which is set up between two high-tension polarized electrodes. This method is herein referred to as the "capacitative" system.

As far as concerns the chambers or reactors, it is known to use tubular reactors for both systems, but only the capacitative system is used with so-called "planar" reactors and in which the electrodes are made of parallel plates.

The method by which the reactant gas is inserted into such chambers has an important effect on the uniformity in thickness of layer deposited, on the layer depositing speed and on the quality of the deposited layer. It is important for the gases to be uniformly distributed in the vicinity of the substrates so as to produce uniform deposits of high quality and with reasonable speed.

In some known apparatus, gas distribution manifolds are ring-shaped, the diameter of the ring being equal to or slightly greater than that of a substrate-carrying electrode. The Manifolds are disposed parallel to said electrode and they have orifices through which the gases escape to be supplied to the substrates.

The gas manifolds can also be of tubular shape and have small holes in them or they can even be rectilinear, the substrates in this case moving past the manifolds.

Known chemical-depositing apparatus using gas-injection components such as have just been described, and in particular, plasma-generating electrodes of the usual type, are the seats of pressure gradients, of variations in gas concentration, and of non-uniform ionization. This causes poor-quality layers to be formed whose thickness is not uniform.

Further, such apparatus have low production capacity and manufacture thereof is difficult to transpose to an industrial scale.

Also, the cost of manufacturing them is relatively high.

Preferred embodiments of the present invention mitigate the drawbacks outlined hereinabove and provide an apparatus for chemically activated deposition in a plasma which apparatus allows excellent-quality uniform deposits to be made while being simple in structure and very reliable.

SUMMARY OF THE INVENTION

The invention provides an apparatus for chemically activated deposition in a plasma, said apparatus comprising a chamber of reactor in which a vacuum is maintained, said chamber or reactor having a longitudinal axis of symmetry and being closed by means of first and second removable end plates; a substrate-support disposed about said axis; a reactive gas distribution manifold; and means for setting up and maintaining a plasma inside said chamber; wherein said manifold comprises two circular end portions interconnected by longitudinally extending pipes, said pipes being provided with gas outlet orifices said manifold being rotatable at uniform speed about the axis of the chamber and inside said substrate-support, said substrate support being of polygonal cross-section and constituted by rectangular longitudinally extending facets on which the substrates are deposited facing the orifices of said manifold.

BRIEF DESCRIPTION OF THE DRAWINGS

The invention is described hereinafter in greater detail with reference to several embodiments given by way of purely illustrative and non-limiting example, with reference to the accompanying drawings in which.

DESCRIPTION OF PREFERRED EMBODIMENTS

Figure 1:
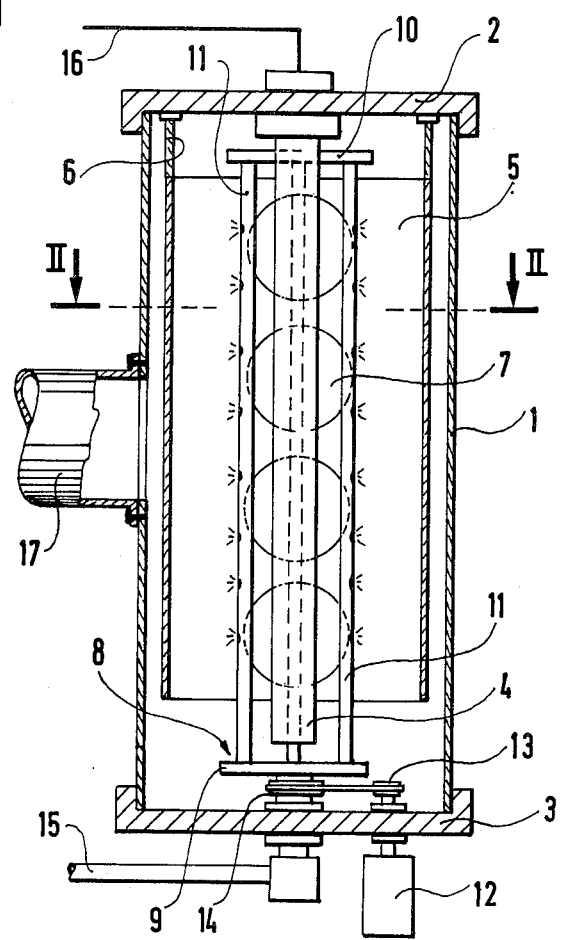
FIG. 1 is a side view in partial section through a first embodiment of apparatus in accordance with the invention.
Figure 2:
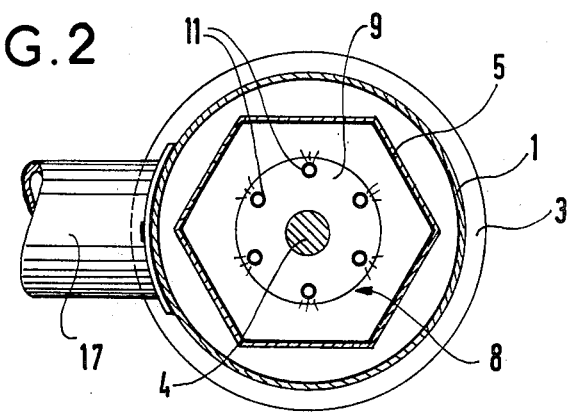
FIG. 2 is a cross-section along line II—II of FIG. 1.

As illustrated in FIGS. 1 and 2, a first apparatus in accordance with the invention includes a cylindrical chamber of reactor 1 which is closed by means of a detachable top cover plate 2 and of a lower cover plate 3 which is also detachable. A cylindrical electrode 4 for generating a plasma in conjunction with a counter electrode is fixed by one of its ends to the top cover plate 2 and extends along the center line of the chamber 1.

Further, a barrel-shaped substrate support 5 is disposed concentrically around the electrode 4. and acts as a counter-electrode to the electrode 4. The support 5 is fixed to said top cover plate 2 by means of tie rods such as 6 and is of polygonal cross-section (in the present case, a hexagonal cross-section) and it is therefore made up of six vertical rectangular facets on which substrates such as 7 are disposed. It can be equipped with a heating or cooling means (not shown). A squirrel-cage rotary manifold 8 for injecting reactant gas is disposed between the electrode 4 and the support 5, and about the axis common to them.

This squirrel-cage manifold has two circular end portions 9 and 10 connected together by axially extending pipes 11 having small holes suitable for directing the gas towards the substrates 7. The manifold is rotated by an external motor 12 and a pair of drive wheels 13 and 14. It is fed with gas by means of a pipe 15 which passes through the bottom cover plate 3.

The support 5, the chamber 1 and the gas manifold 8 may be made of stainless steel for example.

Further, if direct current is supplied, the electrode 4 is connected to a high-tension negative pole or the electrode is connected, if alternating current is supplied, to one pole of a high-frequency source. This is done by means of a cable 16, with the counter-electrode being earthed. The electrode 4 may be water-cooled if necessary.

Lastly, a pipe 17 connects the chamber 1 to a pumping unit (not shown).

The electrode 4 may be made of copper, aluminium or stainless steel. Advantageously, it is covered with a substance such as silicon, chromium or the like as required to avoid polluting the layer deposited on the substrates. It should also be noted that it is preferably substantially longer than the support 5 in the axial direction with a view to providing a uniform electric field inside the support even at its ends.

When the electrode 4 is live relative to the counter-electrode, i.e. at 100 to 10 000 volts therefrom, plasma is generated in the chamber 1. The reactant gas(es) is (are) let into the chamber 1 via the rotary manifold 8 which makes said gas(es) flow towards the substrates 7 in such a way as to allow maximum uniformity of distribution. Further, the manifold rotates at a uniform speed throughout the whole deposition operation thus making uniform distribution of the supply gas possible at all times over the whole of the substrates. This results in a uniform deposition on said substrates. When depositing is ended, the cover plate 2, the electrode 4 and the substrate support 5 are removed and may be discharged in a chamber or airlock above the chamber 1.

Figure 3:
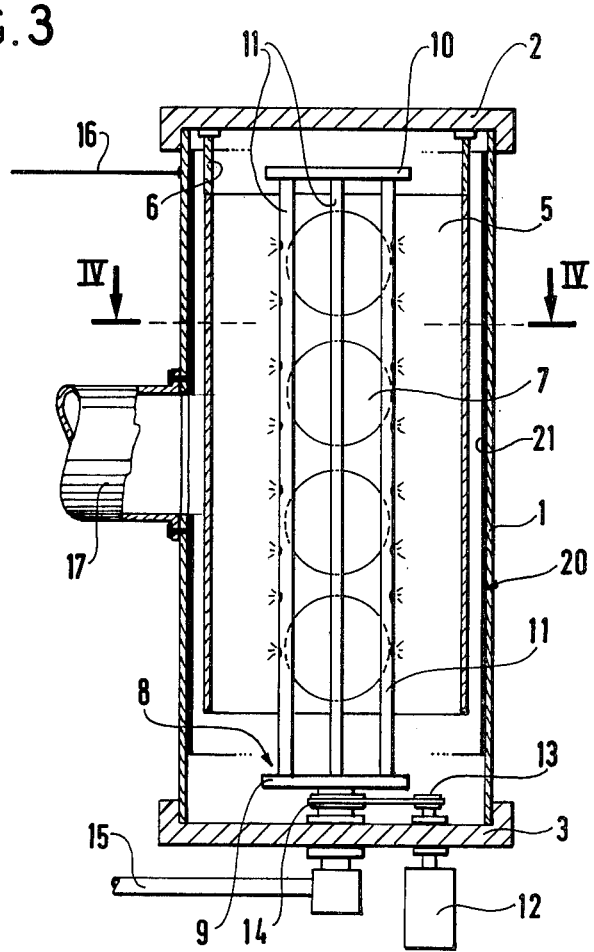
FIG. 3 is a view similar to FIG. 1 of a second embodiment of apparatus in accordance with the invention.
Figure 4:
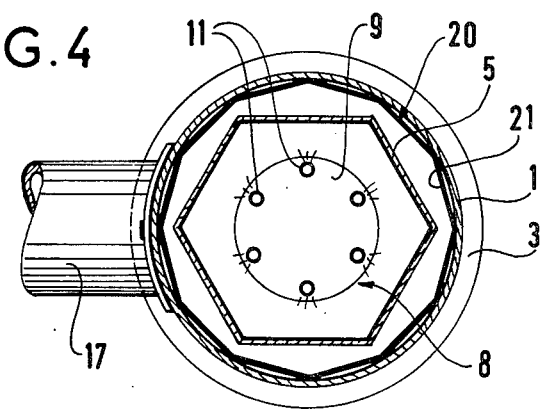
FIG. 4 is a cross-section along line IV—IV of FIG. 3.

In the embodiment illustrated in FIGS. 3 and 4, the same components bear the same reference symbols as previously. However, an electrode 4 is no longer disposed in the centre of the chamber 1.

In this case, an electrode 20 is fixed on or built into the inner wall of the chamber 1 in the form of rectangular components 21 which form an assembly with a polygonal perimeter.

Figure 5:
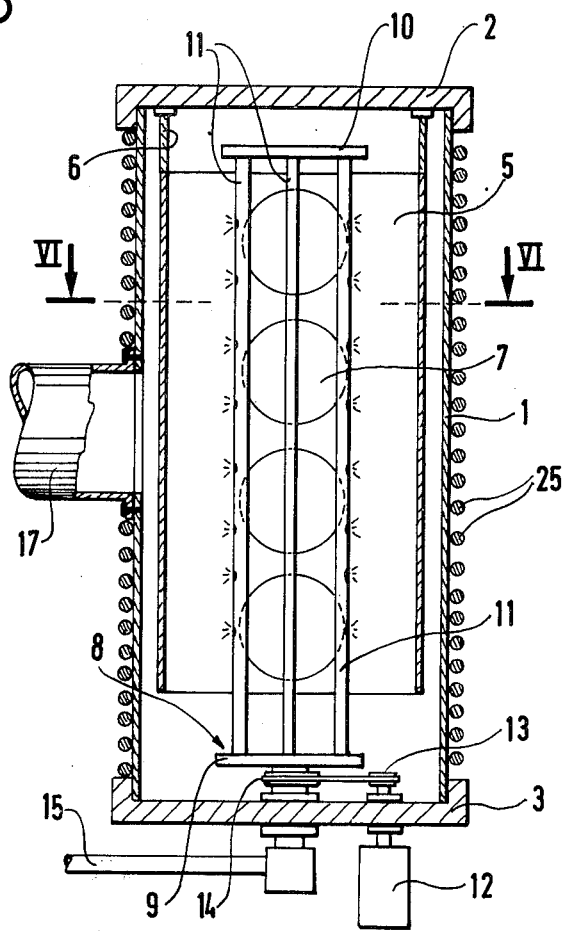
FIG. 5 is a view similar to FIGS. 1 and 3 of a third embodiment of apparatus in accordance with the invention.
Figure 6:
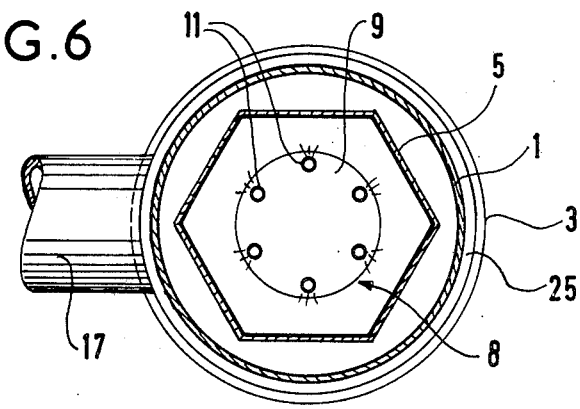
FIG. 6 is a cross-section along line VI—VI of FIG. 5.

In the embodiment illustrated in FIGS. 5 and 6 there is no electrode similar to the preceding cases, since the apparatus operates on the basis of the inductive system instead of on the basis of the capacitive system.

For this purpose, an induction winding 25 is used which is fed with high-frequency current suitable for generating and maintaining a plasma inside the chamber 1.

The winding 25 is disposed on the outside of the chamber 1 which, in this case, is made of silica.

However, said winding could also be disposed inside said chamber 1 which would then be made of metal; the winding must nevertheless be coated with a substance which does not contaminate the substrates because of the deposition effect of the plasma on said winding.

Variants of the apparatus in accordance with the invention can be envisaged.

It is thus possible to increase the degree of ionization of the plasma by superposing a magnetic field over the electric field in the case of capacitative system operation. A magnetic field parallel to the surface of the electrode could be generated by an outer winding or by a stack of magnets sunk in the plasma-generating electrode.

This would increase the depositing speed by increasing molecular activity.

Likewise, the substrates 7 could be connected to the negative DC pole or to one of the high-frequency AC voltage poles so as to remove undesirable particles and to clean the substrates ionically before depositions. In this case, the substrate-support 5 is connected to said voltage source.

Another possibility which can also be envisaged is to rotate the substrate-support 5 about the axis of the reactor 1 during deposition.

Further, if the shapes of the substrates 7 are complex, it may be advantageous to rotate them about their own axes by any suitable means.

The invention is used in particular to deposit metals such as silicon, chromium, aluminium and the like.

What is claimed is:

1. An apparatus for chemically activated deposition in a plasma, said apparatus comprising: a chamber in which a vacuum is maintained, said chamber having a longitudinal axis of symmetry and being closed by means of first and second removable end plates; a substrate support disposed about said axis within said chamber; a reactive gas distribution manifold; and means for setting up and maintaining a plasma inside said chamber, the improvement wherein; said substrate support is of polygonal cross-section, constituted by rectangular longitudinally extending facets, and wherein said manifold comprises two circular end portions interconnected by longitudinally extending pipes, means for rotating said manifold at uniform speed about the axis of the chamber and inside said substrate support, and wherein said pipes are provided with gas outlet orifices on the sides remote from the axis of rotation and facing said substrates borne by said longitudinally extending facets.

2. An apparatus according to claim 1, wherein said means for setting up and maintaining a plasma inside said chamber include a cylindrical electrode disposed in the center of said chamber, fixed at one of its ends to said first end plate and projecting internally of said rotatable manifold, and wherein a counter electrode is formed by the rectangular longitudinally extending facets defining said substrate support.

* * * * *